(12) United States Patent
Huang

(10) Patent No.: US 6,635,209 B2
(45) Date of Patent: Oct. 21, 2003

(54) METHOD OF ENCAPSULATING A SUBSTRATE-BASED PACKAGE ASSEMBLY WITHOUT CAUSING MOLD FLASH

(75) Inventor: Chien-Ping Huang, Hsin-Chu (TW)

(73) Assignee: Siliconware Precision Industries Co., Ltd. (TW)

( * ) Notice: Subject to any disclaimer, the term of this patent is extended or adjusted under 35 U.S.C. 154(b) by 125 days.

(21) Appl. No.: 09/737,673

(22) Filed: Dec. 15, 2000

(65) Prior Publication Data

US 2002/0074690 A1 Jun. 20, 2002

(51) Int. Cl.⁷ ............................. B29C 45/14; B29C 70/70
(52) U.S. Cl. ............. 264/154; 264/272.15; 264/272.17; 264/273; 264/274; 264/275; 264/276
(58) Field of Search ................................. 264/154, 265, 264/271.1, 272.11, 272.15, 272.17, 274, 276, 275, 328.12, 139, 155, 162, 273; 438/126, 127; 29/841; 425/116, 544

(56) References Cited

U.S. PATENT DOCUMENTS

| | | | | |
|---|---|---|---|---|
| 5,306,459 A | * | 4/1994 | Thomason et al. | 264/266 |
| 5,441,684 A | * | 8/1995 | Lee | 264/135 |
| 5,444,025 A | * | 8/1995 | Sono et al. | 257/796 |
| 5,458,716 A | * | 10/1995 | Alfaro et al. | 156/245 |
| 5,609,889 A | * | 3/1997 | Weber | 249/91 |
| 5,776,512 A | * | 7/1998 | Weber | 249/91 |
| 5,929,517 A | * | 7/1999 | Distefano et al. | 174/52.3 |
| 6,027,590 A | * | 2/2000 | Sylvester et al. | 156/150 |

* cited by examiner

Primary Examiner—Angela Ortiz
(74) Attorney, Agent, or Firm—Peter F. Corless; Steven M. Jensen; Edwards & Angell, LLP

(57) ABSTRACT

An improved encapsulation method is proposed for the encapsulation of a substrate-based package assembly, which can help to prevent mold flash over exposed package surfaces after encapsulation process is completed. The proposed encapsulation method is characterized by the forming of a cutaway portion in a solder mask over the substrate along a seam line between the solder mask and the molding tool that would exist between the solder mask and the molding tool when the semi-finished package assembly is fixed in position in the molding tool. During encapsulation process, the cutaway portion defines a constricted flow passage to the injected encapsulation material; and consequently, when the encapsulation material flows into this constricted flow passage, it would more quickly absorb the heat in the molding tool, thereby increasing its viscosity and retarding its flow speed. As a result, the encapsulation material would be less likely to further flow into the seam between the solder mask and the molding tool, thus preventing mold flash over the exposed surface of the solder mask.

17 Claims, 6 Drawing Sheets

METHOD OF ENCAPSULATING A SUBSTRATE-BASED PACKAGE ASSEMBLY WITHOUT CAUSING MOLD FLASH

BACKGROUND OF THE INVENTION

1. Field of the Invention

This invention relates to integrated-circuit packaging technology, and more particularly, to a method of encapsulating a substrate-based package assembly without causing mold flash over exposed package surfaces.

2. Description of Related Art

Encapsulation process is an important step in integrated-circuit packaging technology, by which an epoxy-molded compound (EMC), or called an encapsulation body, is formed to encapsulate the packaged semiconductor chip for the purpose of protecting the packaged semiconductor chip against outside moisture, contamination, and damage.

One problem to the encapsulation of a substrate-based package, however, is that the encapsulation material would easily flash to the exposed package surfaces where electrical contacts are provided, thus adversely degrading the electrical coupling of those electrical contacts to external circuitry. This problem is illustratively depicted in the following with reference to FIGS. 1A–1C, FIGS. 2A–2B, FIGS. 3A–3B, and FIGS. 4A–4C, respectively for four different types of substrate-based packages.

Case 1: Wire-Bonded Single-Chip Package

FIGS. 1A–1C are schematic sectional diagrams used to depict a conventional encapsulation method for a wire-bonded single-chip package.

Referring first to FIG. 1A, this wire-bonded single-chip package assembly includes: (a) a substrate 100 having a front surface 100a and a back surface 100b; (b) a semiconductor chip 110 mounted on the front surface 100a of the substrate 100; (c) a first electrically-insulative layer 121 serving as a top solder mask (S/M) over the front surface 100a of the substrate 100; (d) a second electrically-insulative layer 122 serving as a bottom solder mask over the back surface 100b of the substrate 100; and (e) a plurality of electrical contacts 130 provided on the back surface 100b of the substrate 100 and electrically isolated from each other by the second electrically-insulative layer 122.

The foregoing semi-finished package assembly is to be encapsulated through the use of a molding tool 140 composed of a bottom mold 141 having a flat top surface 141a and an upper mold 142 having a predefined cavity 142a.

Referring to FIG. 1B, during encapsulation process, the semi-finished package assembly shown in FIG. 1A is fixed in the molding tool 140 in such a manner that the second electrically-insulative layer 122 on the back surface 100b of the substrate 100 is abutted on the flat top surface 141a of the bottom mold 141. Then, an encapsulation material, such as epoxy resin, is injected into the mold cavity 142a (through the path indicated by the arrow M in FIG. 1B) to thereby form an encapsulation body 150 to encapsulate the semiconductor chip 110 and the substrate 100.

Undesirably, however, since it would be highly difficult to make the second electrically-insulative layer 122 come into absolutely airtight abutment on the flat top surface 141a of the bottom mold 141, a seam (indicated by the letter S in FIG. 1B) would exist between the second electrically-insulative layer 122 and the bottom mold 141, which would allow a small amount of the encapsulation material to flash over the bottom surface of the second electrically-insulative layer 122.

Referring further to FIG. 1C, as the encapsulation process is completed, the encapsulated package assembly is taken out from the molding tool 140. As a consequence of mold flash, a mass of mold flash 150a would be undesirably left over the exposed bottom surface of the second electrically-insulative layer 122 and even over the electrical contacts 130. The mold flash 150a would undesirably make the resulted package unit spoiled in its outer appearance and make the electrical contacts 130 unable to be reliably electrically coupled to external circuitry.

One solution to the foregoing problem of mold flash is to perform a de-flash process through the use of sanding means or laser means to remove the mold flash 150a. One drawback to this solution, however, is that it would easily cause damage to the substrate surfaces, thus spoiling the outer appearance of the resulted package unit.

Case 2: Wire-Bonded Stacked-Dual-Chip Package

FIGS. 2A–2B are schematic sectional diagrams used to depict a conventional encapsulation method for a wire-bonded stacked-dual-chip package which also suffers from the problem of mold flash.

As shown in FIG. 2A, this wire-bonded stacked-dual-chip package assembly includes: (a) a substrate 200 having a front surface 200a and a back surface 200b; (b) a pair of stacked semiconductor chips 211, 212 mounted on the front surface 200a of the substrate 200; and (c) an electrically-insulative layer 220 serving as a solder mask (S/M) over the back surface 200b of the substrate 200.

In encapsulation process, the same molding tool as the one shown in FIGS. 1A–1B can be used to encapsulate the foregoing semi-finished package assembly, so detailed description thereof will not be repeated herein.

As further shown in FIG. 2B, as the encapsulation process is completed, a mass of mold flash 250a would be undesirably left over the edge of the exposed back surface of the electrically-insulative layer 220.

Case 3: Flip-Chip Package

FIGS. 3A–3B are schematic sectional diagrams used to depict a conventional encapsulation method for a flip-chip package which also suffers from the problem of mold flash.

As shown in FIG. 3A, this flip-chip package assembly includes: (a) a substrate 300 having a front surface 300a and a back surface 300b; (b) a semiconductor chip 310 mounted in an upside-down (i.e., flip chip) manner on the front surface 300a of the substrate 300; and (c) an electrically-insulative layer 320 serving as a solder mask (S/M) over the back surface 300b of the substrate 300.

In encapsulation process, the same molding tool as the one shown in FIGS. 1A–1B can be used to encapsulate the foregoing semi-finished package assembly, so detailed description thereof will not be repeated herein.

As further shown in FIG. 3B, after the encapsulation process is completed, a mass of mold flash 350a would be undesirably left over the edge of the exposed back surface of the electrically-insulative layer 320.

In the foregoing three cases, the problem of mold flash occurs on the exposed back surface of the electrically-insulative layer coated over the back surface of the substrate. However, the problem of mold flash may also occur on the front surface of the substrate, as in the case of a BGA package depicted in the following with reference to FIGS. 4A–4C.

Case 4: BGA-Package

FIGS. 4A–4C are schematic sectional diagrams used to depict a conventional encapsulation method for a BGA (all Grid Array) package which also suffers from the problem of mold flash.

Referring first to FIG. 4A, this BGA package assembly includes: (a) a substrate 400 having a front surface 400a and a back surface 400b; (b) a semiconductor chip 410 mounted on the front surface 400a of the substrate 400; (c) a first electrically-insulative layer 421 serving as a top solder mask (S/M) over the front surface 400a of the substrate 400; (d) a second electrically-insulative layer 422 serving as a bottom solder mask (S/M) over the back surface 400b of the substrate 400; and (e) a plurality of solder-ball pads 430 provided on the back surface 400b of the substrate 400 and electrically isolated from each other by the second electrically-insulative layer 422.

The foregoing semi-finished BGA package assembly is to be encapsulated through the use of a molding tool 440 composed of a bottom mold 441 having a flat top surface 441a and an upper mold 442 having a predefined cavity 442a and a flat bottom surface 442b.

Referring to FIG. 4B, during encapsulation process, the semi-finished BGA package assembly shown in FIG. 4A is fixed between the bottom mold 441 and the upper mold 442, in such a manner that the second electrically-insulative layer 422 on the back surface 400b of the substrate 400 is rested on the flat top surface 441a of the bottom mold 441, while the semiconductor chip 410 is entirely accommodated within the mold cavity 442a. Then, an encapsulation material, such as epoxy resin, is injected into the mold cavity 442a (through the path indicated by the arrow M in FIG. 4B) to thereby form an encapsulation body 450 to encapsulate the semiconductor chip 410 and the substrate 400.

Undesirably, however, since it would be highly difficult to make the flat bottom surface 442b of the upper mold 442 come into absolutely airtight abutment on the first electrically-insulative layer 421, a small amount of the encapsulation material would flash through the seam indicated by S in FIG. 4B to the top surface of the first electrically-insulative layer 421.

Referring further to FIG. 4C, as the encapsulation process is completed, the encapsulated package assembly is taken out from the molding tool 440. As a consequence of mold flash, a mass of mold flash 450a would be undesirably left over the exposed top surface of the first electrically-insulative layer 421, thus undesirably spoiling the outer appearance of the resulted package unit.

Related patents, include, for example, the U.S. Pat. No. 6,040,622, which discloses a substrate-based package configuration for the fabrication of a multi-media card (MMC). In the utilization of this patented technology, however, mold flash is still a problem.

SUMMARY OF THE INVENTION

It is therefore an objective of this invention to provide a method for encapsulating a substrate-based package assembly without causing mold flash over exposed package surfaces.

In accordance with the foregoing and other objectives, a new encapsulation method for substrate-based package assembly is proposed.

Broadly recited, the encapsulation method of the invention comprises the following steps: (1) preparing a molding tool having a predefined cavity; (2) forming a cutaway portion in the electrically-insulative layer along a seam line between the electrically-insulative layer and the solid part of the molding tool that would exist between the electrically-insulative layer and the solid part of the molding tool when the substrate-based package assembly is fixed in position in the molding tool, the cutaway portion being dimensioned to a predetermined height and a predetermined width; (3) fixing the substrate-based package assembly in the cavity of the molding tool, with the cutaway portion defining a constricted flow passage between the substrate and the solid part of the molding tool and (4) injecting an encapsulation material into the cavity of the molding tool for the purpose of molding an encapsulation body for encapsulating the substrate-based package assembly, wherein the flow of the encapsulation material within the constricted flow passage is retarded in speed and increased in viscosity.

During the encapsulation process, the cutaway portion defines a constricted flow passage to the injected encapsulation material; and consequently, when the encapsulation material flows into this constricted flow passage, it would more quickly absorb the heat in the solid part of the molding tool, thereby increasing its viscosity and retarding its flow speed. As a result, the encapsulation material would be less likely to further flow into the seam between the electrically-insulative layer and the solid part of the molding tool, thus preventing mold flash over the exposed surface of the electrically-insulative layer.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The encapsulation method of the invention is disclosed in full details by way of several preferred embodiments in the following with reference to FIGS. 5A–5C, FIGS. 6A–6B, FIGS. 7A–7B, and FIGS. 8A–8C, respectively for four different package types.

Figure 5A:
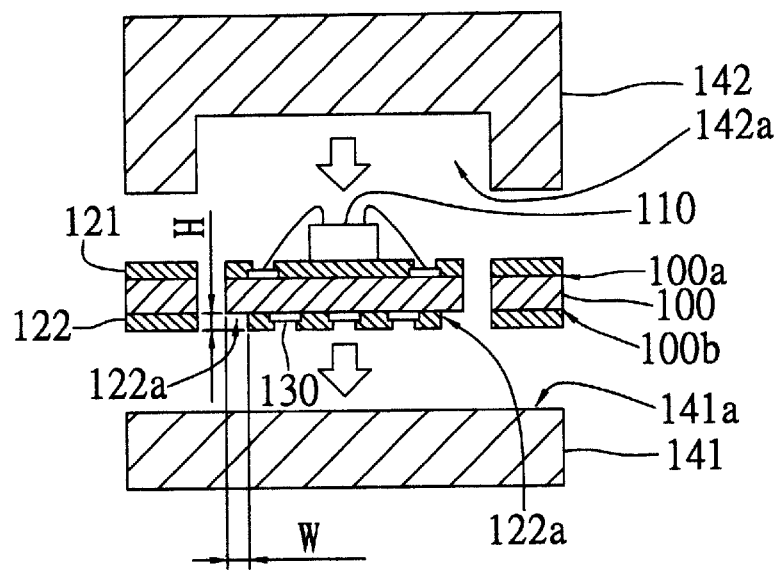
FIGS. 5A–5C are schematic sectional diagrams used to depict a first preferred embodiment of the encapsulation method of the invention for a wire-bonded single-chip package.
Figure 5B:
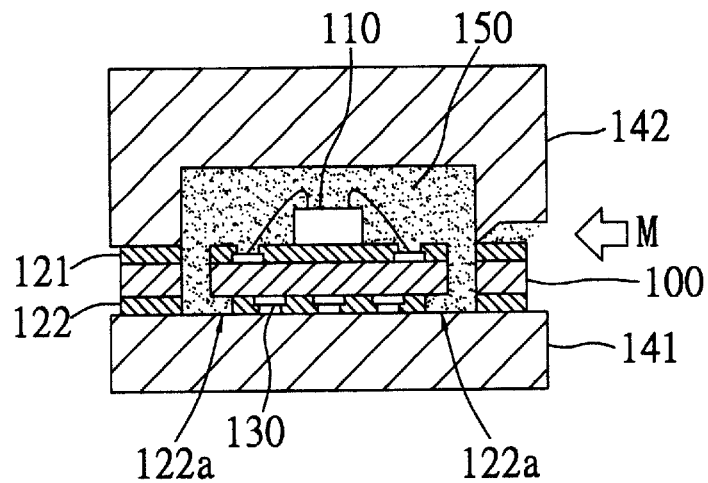
Figure 5C:
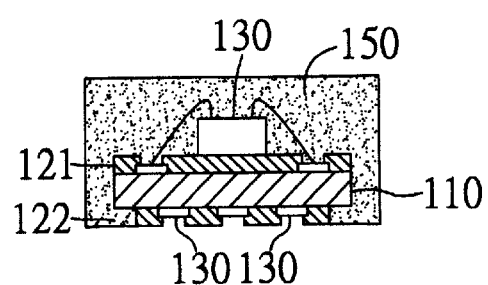

First Preferred Embodiment (FIGS. 5A–5C)

Figure 1A:
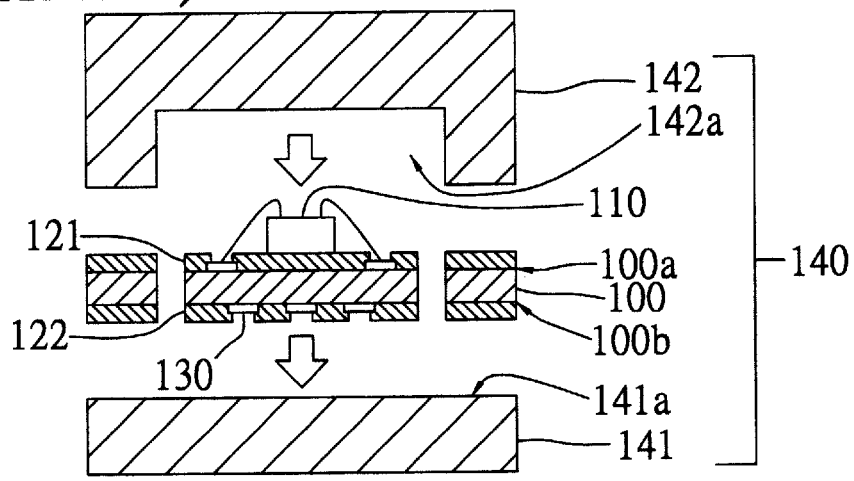
FIGS. 1A–1C (PRIOR ART) are schematic sectional diagrams used to depict a conventional encapsulation method for a wire-bonded single-chip package.
Figure 1B:
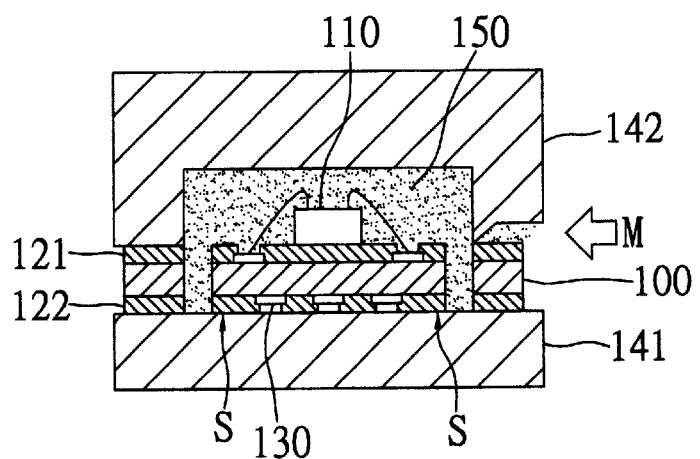
Figure 1C:
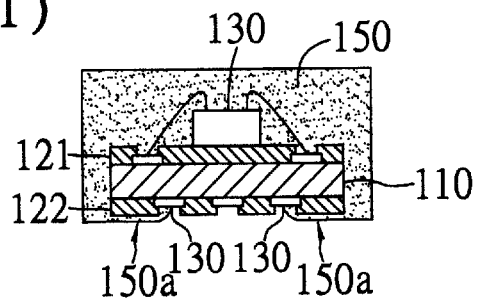

The first preferred embodiment of the encapsulation method of the invention serves as a solution to the problem of mold flash during the encapsulation of the wire-bonded single-chip package depicted in FIGS. 1A–1C, and which is disclosed in full details in the following with reference to FIGS. 5A–5C (note that in FIGS. 5A–5C, the same components as those in FIGS. 1A–1C are labeled with the same reference numerals).

Referring first to FIG. 5A, this wire-bonded single-chip package assembly includes: (a) a substrate 100 having a front surface 100a and a back surface 100b; (b) a semiconductor chip 110 mounted on the front surface 100a of the substrate 100; (c) a first electrically-insulative layer 121 serving as a top solder mask (S/M) over the front surface 100a of the substrate 100; (d) a second electrically-insulative layer 122 serving as a bottom solder mask over the back surface 100b of the substrate 100; and (e) a plurality of electrical contacts 130 provided on the back surface 100b of the substrate 100 and electrically isolated from each other by the second electrically-insulative layer 122.

It is a key feature of the invention that a step-like cutaway portion 122a is formed along the edge of the second electrically-insulative layer 122 on the back surface 100b of the substrate 100. This step-like cutaway portion 122a is preferably dimensioned to a height H of from 0.01 mm to 0.05 mm and a width W of from 0.4 mm to 1.2 mm, and most preferably 0.03 mm and 0.6 mm, respectively.

The foregoing semi-finished package assembly is to be encapsulated through the use of a molding tool 140 composed of a bottom mold 141 having a flat top surface 141a and an upper mold 142 having a predefined cavity 142a.

Referring to FIG. 5B, during encapsulation process, the semi-finished package assembly shown in FIG. 5A is fixed in the molding tool 140 in such a manner that the second electrically-insulative layer 122 on the back surface 100b of the substrate 100 is abutted on the flat top surface 141a of the bottom mold 141. Then an encapsulation material, such as epoxy resin, is injected into the mold cavity 142a (through the path indicated by the arrow M in FIG. 5B) for the molding of an encapsulation body 150 to encapsulate the semiconductor chip 110 and the substrate 100.

During the foregoing encapsulation process, it can be seen that the step-like cutaway portion 122a defines a constricted flow passage to the injected encapsulation material; and consequently, when the encapsulation material flows into this constricted flow passage, it would more quickly absorb the heat of the bottom mold 141, thereby increasing its viscosity and retarding its flow speed. As a result, the encapsulation material would be less likely to further flow into the seam between the second electrically-insulative layer 122 and the bottom mold 141, thus preventing mold flash over the bottom surface of the second electrically-insulative layer 122 and the electrical contacts 130.

Referring further to FIG. 5C, after the encapsulation process is completed, the encapsulated package assembly is taken out of the molding tool 140. Compared to the prior art of FIG. 1C, the invention allows substantially no mold flash to be left over the bottom surface of the second electrically-insulative layer 122 and the electrical contacts 130, thus allowing the resulted package unit to be assured in the quality of its outer appearance and its electrical coupling through the electrical contacts 130 to external circuitry.

Figure 6A:
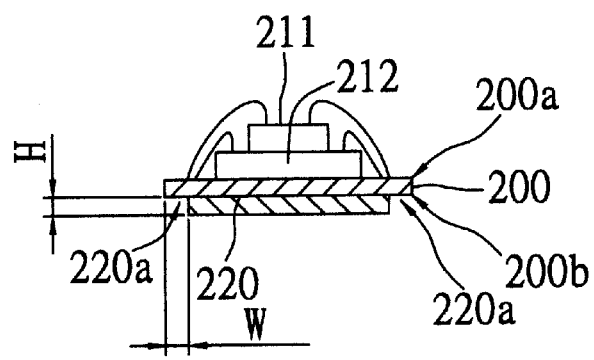
FIGS. 6A–6B are schematic sectional diagrams used to depict a second preferred embodiment of the encapsulation method of the invention for a wire-bonded stacked-dual-chip package.
Figure 6B:
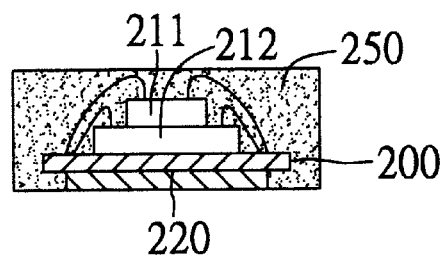

Second Preferred Embodiment (FIGS. 6A–6B)

Figure 2A:
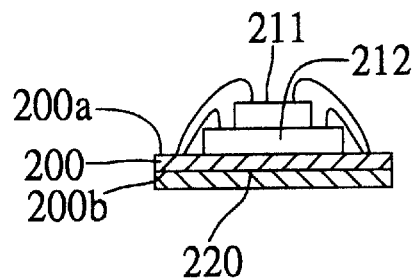
FIGS. 2A–2B (PRIOR ART) are schematic sectional diagrams used to depict a conventional encapsulation method for a wire-bonded stacked-dual-chip package.
Figure 2B:
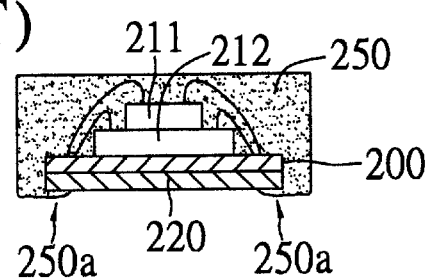

The second preferred embodiment of the encapsulation method of the invention serves as a solution to the problem of mold flash during the encapsulation of the wire-bonded stacked-dual-chip package depicted in FIGS. 2A–2B, and which is disclosed in full details in the following with reference to FIGS. 6A–6B (note that in FIGS. 6A–6B, the same components as those in FIGS. 2A–2B are labeled with the same reference numerals).

As shown in FIG. 6A, this wire-bonded stacked-dual-chip package assembly includes: (a) a substrate 200 having a front surface 200a and a back surface 200b; (b) a pair of stacked semiconductor chips 211, 212 mounted on the front surface 200a of the substrate 200; and (c) an electrically-insulative layer 220 serving as a solder mask (S/M) over the back surface 200b of the substrate 200.

It is a key feature of the invention that a step-like cutaway portion 220a is formed along the edge of the electrically-insulative layer 220. This step-like cutaway portion 220a is preferably dimensioned to a height H of from 0.01 mm to 0.05 mm and a width W of from 0.4 mm to 1.2 mm, and most preferably 0.03 mm and 0.6 mm, respectively.

In encapsulation process, the same molding tool as the one shown in FIGS. 5A–5B can be used to encapsulate the foregoing semi-finished package assembly, so detailed description thereof will not be repeated herein. During the encapsulation process, the step-like cutaway portion 220a defines a constricted flow passage to the injected encapsulation material, so that it can also help to prevent mold flash over the bottom surface of electrically-insulative layer 220.

As shown in FIG. 6B, after the encapsulation process is completed, no mold flash would be left over the edge of the bottom surface of the electrically-insulative layer 220 as in the case of the prior art shown in FIG. 2B.

Figure 7A:
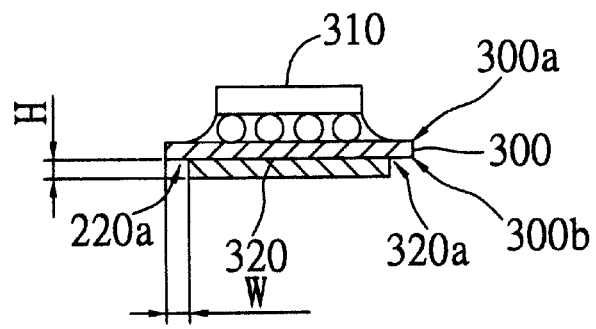
FIGS. 7A–7B are schematic sectional diagrams used to depict a third preferred embodiment of the encapsulation method of the invention for a flip-chip package.
Figure 7B:
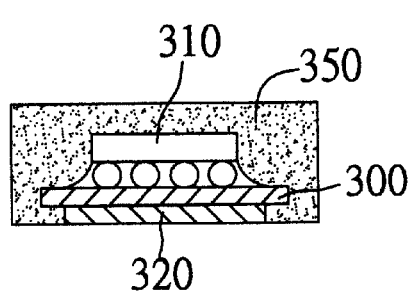

Third Preferred Embodiment (FIGS. 7A–7B)

Figure 3A:
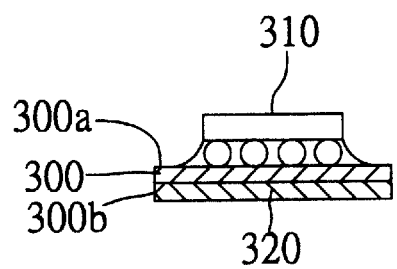
FIGS. 3A–3B (PRIOR ART) are schematic sectional diagrams used to depict a conventional encapsulation method for a flip-chip package.
Figure 3B:
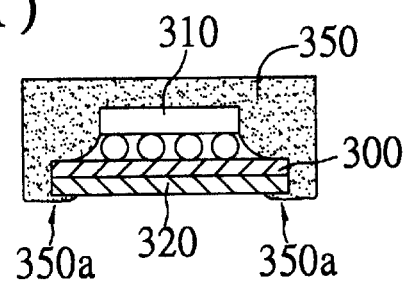

The third preferred embodiment of the encapsulation method of the invention serves as a solution to the problem of mold flash during the encapsulation of the flip-chip package depicted in FIGS. 3A–3B, and which is disclosed in full details in the following with reference to FIGS. 7A–7B (note that in FIGS. 7A–7B, the same components as those in FIGS. 3A–3B are labeled with the same reference numerals).

As shown in FIG. 7A, this flip-chip package assembly includes: (a) a substrate 300 having a front surface 300a and a back surface 300b; (b) a semiconductor chip 310 mounted in an upside-down (i.e., flip chip) manner on the front surface 300a of the substrate 300; and (c) an electrically-insulative layer 320 serving as a solder mask (S/M) over the back surface 300b of the substrate 300.

It is a key feature of the invention that a step-like cutaway portion 320a is formed along the edge of the electrically-insulative layer 320. This step-like cutaway portion 320a is preferably dimensioned to a height H of 0.05 mm and a width W of from 0.4 mm to 1.2 mm, and most preferably 0.6 mm.

In encapsulation process, the same molding tool as the one shown in FIGS. 5A–5B can be used to encapsulate the foregoing semi-finished package assembly, so detailed description thereof will not be repeated herein. During the encapsulation process, the step-like cutaway portion 320a defines a constricted flow passage to the injected encapsulation material, so that it can also help to prevent mold flash over the bottom surface of electrically-insulative layer 320.

As shown in FIG. 7B, after the encapsulation process is completed, no mold flash would be left over the edge of the bottom surface of the electrically-insulative layer 320 as in the case of the prior art shown in FIG. 3B.

Figure 8A:
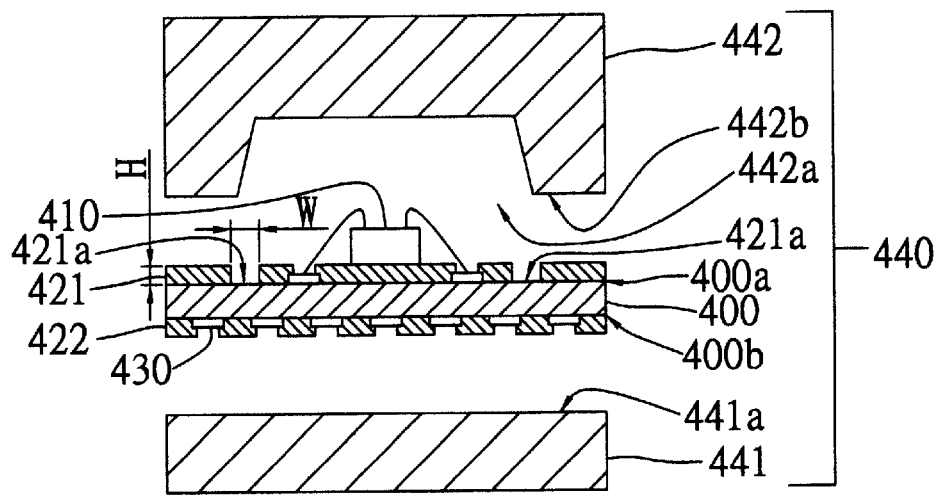
FIGS. 8A–8C are schematic sectional diagrams used to depict a fourth preferred embodiment of the encapsulation method of the invention for a BGA package.
Figure 8B:
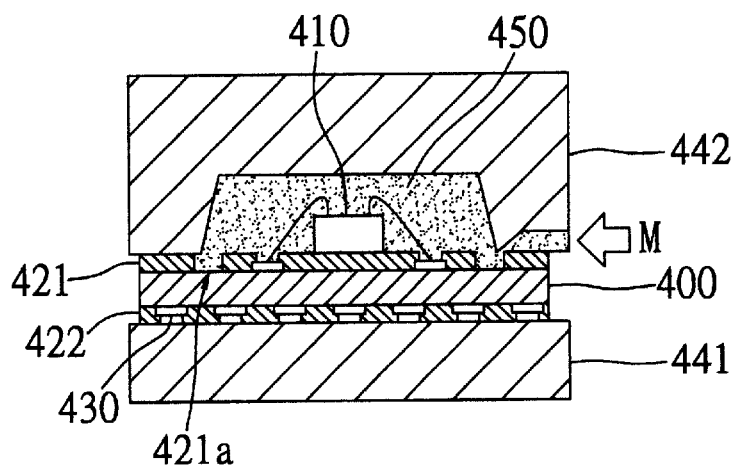
Figure 8C:
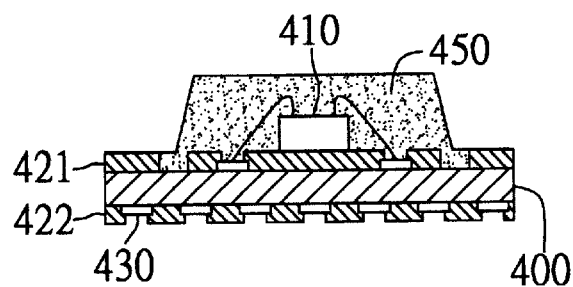

Fourth Preferred Embodiment (FIGS. 8A–8C)

Figure 4A:
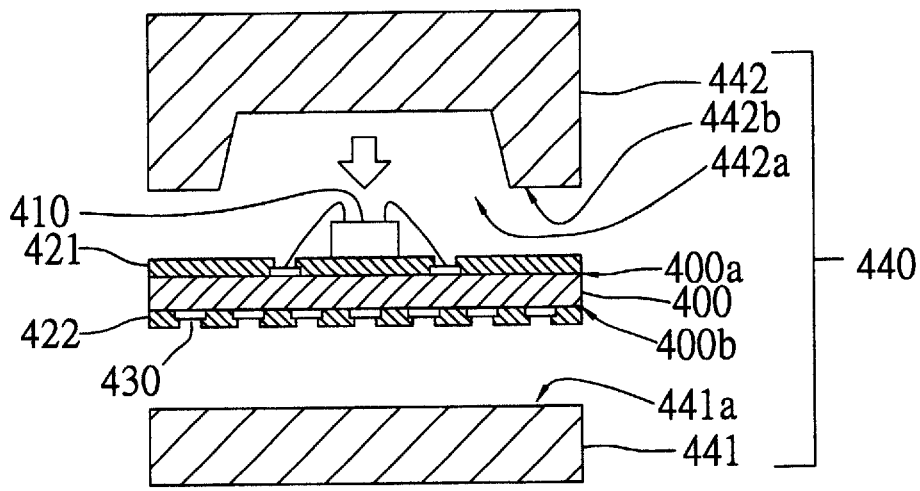
FIGS. 4A–4C (PRIOR ART) are schematic sectional diagrams used to depict a-conventional encapsulation method for a BGA package.
Figure 4B:
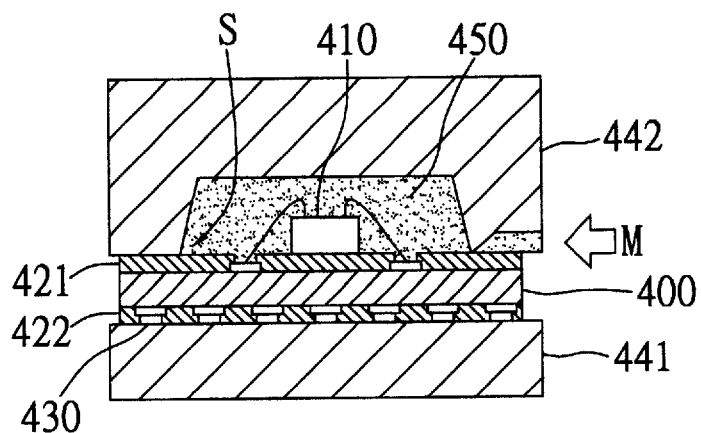
Figure 4C:
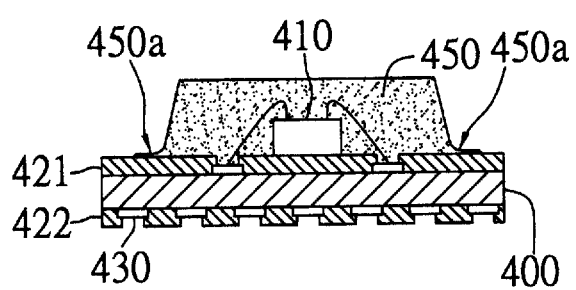

The fourth preferred embodiment of the encapsulation method of the invention serves as a solution to the problem of mold flash during the encapsulation of the BGA package shown in FIGS. 4A–4C, and which is disclosed in full details in the following with reference to FIGS. 8A–8C (note that in FIGS. 8A–8C, the same components as those in FIGS. 4A–4C are labeled with the same reference numerals).

Referring first to FIG. 8A, this BGA package assembly includes: (a) a substrate 400 having a front surface 400a and a back surface 400b; (b) a semiconductor chip 410 mounted on the front surface 400a of the substrate 400; (c) a first electrically-insulative layer 421 serving as a top solder mask (S/M) over the front surface 400a of the substrate 400; (d) a second electrically-insulative layer 422 serving as a bottom solder mask (S/M) over the back surface 400b of the substrate 400; and (e) a plurality of solder-ball pads 430 provided on the back surface 400b of the substrate 400 and electrically isolated from each other by the second electrically-insulative layer 422.

The foregoing semi-finished BGA package assembly is to be encapsulated through the use of a molding tool 440 composed of a bottom mold 441 having a flat top surface 441a and an upper mold 442 having a predefined cavity 442a and a flat bottom surface 442b.

It is a key feature of the invention that a groove-like cutaway portion 421a is formed in the first electrically-insulative layer 421 along a seam line that would exist between the first electrically-insulative layer 421 and the solid part of the upper mold 442 when the semi-finished BGA package assembly is fixed in position in the molding tool 440 during encapsulation process. This groove-like cutaway portion 421a is preferably dimensioned to a height H of from 0.01 mm to 0.05 mm and a width W of from 0.4 mm to 1.2 mm, and most preferably 0.03 mm and 0.6 mm, respectively.

Referring further to FIG. 8B, the semi-finished BGA package assembly shown in FIG. 8A is fixed between the bottom mold 441 and the upper mold 442, in such a manner that the second electrically-insulative layer 422 on the back surface 400b of the substrate 400 is rested on the flat top surface 441a of the bottom mold 441, while the semiconductor chip 410 is entirely accommodated within the mold cavity 442a. Then, an encapsulation material, such as epoxy resin, is injected into the mold cavity 442a (through the path indicated by the arrow M in FIG. 4B) to thereby form an encapsulation body 450 to encapsulate the semiconductor chip 410 and the substrate 400.

During the foregoing encapsulation process, it can be seen that the groove-like cutaway portion 421a defines a constricted flow passage to the injected encapsulation material; and consequently, when the encapsulation material flows into this constricted flow passage, it would more quickly absorb the heat of the upper mold 442, thereby increasing its viscosity and retarding its flow speed. As a result, the encapsulation material would be less likely to further flow into the seam between the first electrically-insulative layer 421 and the upper mold 442, thus preventing mold flash over the top surface of the first electrically-insulative layer 421.

Referring further to FIG. 8C, after the encapsulation process is completed, the encapsulated package assembly is taken out of the molding tool 440. Compared to FIG. 4C, the invention would substantially allow no mold flash to be left over the exposed top surface of the first electrically-insulative layer 421, thus making the resulted package unit assured in the quality of its outer appearance.

Conclusion

In the forgoing detailed description, the invention is utilized on four different kinds of package configurations for the purpose of preventing mold flash over exposed package surfaces during encapsulation process. Broadly recited, the invention is suitable for use on a substrate-based package configuration having a substrate, at least one semiconductor chip mounted on the substrate, and an electrically-insulative layer formed over one surface of the substrate, for the purpose of preventing mold flash over exposed package surfaces after encapsulation process.

The invention is characterized by the forming of a cutaway portion along in the electrically-insulative layer along a seam line between the electrically-insulative layer and the solid part of the molding tool that would exist between the electrically-insulative layer and the solid part of the molding tool when the semi-finished package assembly is fixed in position in the molding tool. During encapsulation process, the cutaway portion defines a constricted flow passage to the injected encapsulation material; and consequently, when the encapsulation material flows into this constricted flow passage, it would more quickly absorb the heat in the solid part of the molding tool, thereby increasing its viscosity and retarding its flow speed. As a result, the encapsulation material would be less likely to further flow into the seam between the electrically-insulative layer and the solid part of the molding tool, thus preventing mold flash over the exposed surface of the electrically-insulative layer.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for encapsulating a substrate-based package assembly including a substrate and an electrically-insulative layer formed over one surface of the substrate, the method comprising the steps of:

(1) preparing a molding tool having a predefined cavity;
   (2) forming a cutaway portion in the electrically-insulative layer along a scam line between the electrically-insulative layer and the solid part of the molding tool that would exist between the electrically-insulative layer and the solid part of the molding tool when the substrate-based package assembly is fixed in position in the molding tool, the cutaway portion being dimensioned to a predetermined height and a predetermined width;
   (3) fixing the substrate-based package assembly in the cavity of the molding tool, with the cutaway portion defining a constricted flow passage between the substrate and the solid part of the molding tool; and
   (4) injecting an encapsulation material into the cavity of the molding tool for the purpose of molding an encapsulation body for encapsulating the substrate-based package assembly, wherein the flow of the encapsulation material within the constricted flow passage is retarded in speed and increased is viscosity.

2. The method of claim 1, wherein in said step (2), the cutaway portion in the electrically-insulative layer is dimensioned to a height of from 0.01 mm to 0.05 mm and a width of from 0.4 mm to 1.2 mm.

3. The method of claim 2, wherein the cutaway portion in the electrically-insulative layer is dimensioned to a height 0.03 mm and a width of 0.6 mm.

4. The method of claim 1, wherein the substrate-based package assembly is a wire-bonded single-chip package.

5. The method of claim 1, wherein the substrate-based package assembly is a wire-bonded stacked-dual-chip package.

6. The method of claim 1, wherein the substrate-based package assembly is a flip-chip package.

7. The method of claim 1, wherein the substrate-based package assembly is a BGA package.

8. A method for encapsulating a substrate-based package assembly including a substrate having a front surface and a back surface, at least one semiconductor chip mounted over the front surface of the substrate, and an electrically-insulative layer formed over the back surface of the substrate, the method comprising the steps of:

(1) preparing a molding tool having a predefined cavity;

(2) forming a stepped cutaway portion along the edge of the electrically-insulative layer, which is dimensioned to a predetermined height and a predetermined width;

(3) fixing the substrate-based package assembly in the cavity of the molding tool, with the stepped cutaway portion defining a constricted flow passage between the substrate and the solid part of the molding tool; and (4) injecting an encapsulation material into the cavity of the molding tool for the purpose of molding an encapsulation body for encapsulating the substrate-based package assembly, wherein the flow of the encapsulation material within the constricted flow passage is retarded in speed and increased in viscosity.

9. The method of claim 8, wherein in said step (2), the stepped cutaway portion in the electrically-insulative layer is dimensioned to a height of from 0.01 nun to 0.05 mm and a width of from 0.4 mm to 1.2 mm.

10. The method of claim 9, wherein the stepped cutaway portion in the electrically-insulative layer is dimensioned to a height of 0.03 mm and a width of 0.6 mm.

11. The method of claim 8, wherein the substrate-based package assembly is a wire-bonded single-chip package.

12. The method of claim 8, wherein the substrate-based package assembly is a wire-bonded stacked-dual-chip package.

13. The method of claim 8, wherein the substrate-based package assembly is a flip-chip package.

14. A method for encapsulating a substrate-based package assembly including a substrate having a front surface and a back surface, an electrically-insulative layer formed over the front surface of the substrate, and at least one semiconductor chip mounted over the electrically-insulative layer, the method comprising the steps of:

(1) preparing a molding tool having a predefined cavity;

(2) forming a grooved cutaway portion in the electrically-insulative layer along a seam line between the electrically-insulative layer and the solid pan of the molding tool that would exist between the electrically-insulative layer and the solid part of rim molding tool when the substrate-based package assembly is fixed in position in the molding tool, the grooved cutaway portion being dimensioned to a predetermined height and a predetermined width;

(3) fixing the substrate-based package assembly in the cavity of the molding tool, with the grooved cutaway portion defining a constricted flow passage between the substrate and the solid part of the molding tool; and (4) injecting an encapsulation material into the cavity of the molding tool for the purpose of molding an encapsulation body for encapsulating the substrate-based package assembly, wherein the flow of the encapsulation material within the constricted flow passage is retarded in speed and increased in viscosity.

15. The method of claim 14, wherein in said step (2), the grooved cutaway portion in the electrically-insulative layer is dimensioned to a height of from 0.01 mm to 0.05 mm and a width of from 0.4 mm to 1.2 mm.

16. The method of claim 15, wherein the grooved cutaway portion in the electrically-insulative layer is dimensioned to a height of 0.03 mm and a width of 0.6 mm.

17. The method of claim 14, wherein the substrate-based package assembly is a BGA package.

* * * * *